(12) United States Patent
Ushioda et al.

(10) Patent No.: US 11,751,341 B2
(45) Date of Patent: Sep. 5, 2023

(54) ELECTRONIC APPARATUS AND STRUCTURE

(71) Applicant: LENOVO (SINGAPORE) PTE. LTD., Singapore (SG)

(72) Inventors: Tatsuya Ushioda, Yokohama (JP); Jun Iwasaki, Yokohama (JP); Masaaki Bandoh, Yokohama (JP); Ryota Watanabe, Yokohama (JP); Hiroshi Yamazaki, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 137 days.

(21) Appl. No.: 17/305,949

(22) Filed: Jul. 19, 2021

(65) Prior Publication Data
US 2022/0078924 A1 Mar. 10, 2022

(30) Foreign Application Priority Data

Sep. 10, 2020 (JP) .................................. 2020-151844

(51) Int. Cl.
*H05K 5/00* (2006.01)
*F16B 43/00* (2006.01)
(Continued)

(52) U.S. Cl.
CPC ........... *H05K 5/0008* (2013.01); *F16B 35/00* (2013.01); *F16B 43/00* (2013.01); *G06F 1/1628* (2013.01); *H05K 7/205* (2013.01)

(58) Field of Classification Search
CPC ...... H05K 5/0008; H05K 7/205; F16B 35/00; F16B 5/0208; F16B 5/02; F16B 5/065;
(Continued)

(56) References Cited

U.S. PATENT DOCUMENTS 6,603,665 B1 *  8/2003  Truong ............... H01L 23/4012
                                                        361/752
7,352,586 B2 *  4/2008  Kuang .................... G06F 1/183
                                                        165/185
(Continued)

FOREIGN PATENT DOCUMENTS

JP       58121577 A       7/1983
JP    2002347656 A  * 12/2002    ............ F16B 5/0233
(Continued)

*Primary Examiner* — Anatoly Vortman
*Assistant Examiner* — Zhengfu J Feng
(74) *Attorney, Agent, or Firm* — SHIMOKAJI IP

(57) ABSTRACT

An electronic apparatus includes a bottom cover, a main board provided with a stud, a screw, a washer, and a sponge. The screw has a head portion having a diameter larger than that of an attachment hole, a male screw portion configured to be screwed into a first female screw portion, and a columnar portion having a diameter smaller than a root diameter of the male screw portion. The washer has a flange portion having a diameter larger than that of the attachment hole, a cylindrical portion having a diameter smaller than that of the attachment hole, and a second female screw portion which the male screw portion is screwable into and passable through. The head portion abuts on the bottom cover to fix the bottom cover by the male screw portion. The flange portion is between the stud and the bottom cover.

7 Claims, 8 Drawing Sheets

(51) Int. Cl.
*G06F 1/16* (2006.01)
*H05K 7/20* (2006.01)
*F16B 35/00* (2006.01)

(58) Field of Classification Search
CPC ...... F16B 41/002; F16B 11/006; F16B 35/04;
F16B 37/00; F16B 43/00; G06F 1/1628;
G06F 1/1658
USPC ..................................................... 361/679.54
See application file for complete search history.

(56) References Cited

U.S. PATENT DOCUMENTS

2006/0039119 A1\* 2/2006 Karuishi ............. H01L 23/4006
257/E23.084
2016/0360077 A1\* 12/2016 Miura ....................... G02B 7/14

FOREIGN PATENT DOCUMENTS

| JP | 2002347656 | A | | 12/2002 | |
|----|------------|---|---|---------|---|
| JP | 2005061613 | A | | 3/2005 | |
| JP | 2007281279 | A | \* | 10/2007 | ............... H05K 7/20 |
| JP | 2018044590 | A | | 3/2018 | |

\* cited by examiner

ELECTRONIC APPARATUS AND STRUCTURE

FIELD OF THE INVENTION

The present invention relates to an electronic apparatus and a structure in which a fixing member and a fixed member are fixed with screws.

BACKGROUND OF THE INVENTION

In a chassis of an electronic apparatus such as a laptop personal computer (laptop PC) or a tablet personal computer (tablet PC), a structure in which two chassis members are laminated and connected to be formed in a flat box shape is widely used.

In a laptop PC, a structure in which two chassis members on the top and bottom are laminated and screwed together is used for a main body chassis provided with a keyboard, and electronic components such as a CPU, memory, and battery are stored in its internal space. Since relatively small fastening force suffices to fix the two chassis members together, a small screw, such as an M2 or M3 size screw, is used. Use of such a small screw makes an appropriate design.

In addition, when two members are fastened with a fastening member such as a screw, a washer may be used, for example, in order to prevent looseness in fastening. When a user sometimes removes screws from chassis members to replace components of a laptop PC, there are concerns that the user may lose screws or washers or forget to attach washers.

In a laptop PC described in Japanese Unexamined Patent Application Publication No. 2018-44590, a right-handed female screw portion is formed in a stud of a fixing member while a left-handed female screw portion is formed in an attachment hole of a fixed member. Then, a screw used has a right-handed male screw portion at its tip. That is, the right-handed screw portion and left-handed screw portion are adjacently arranged. The left-handed screw portion screws into and passes through the left-handed screw portion in the attachment hole. Then, the screw is prevented from slipping out because an outer diameter of a screw thread is larger than an inner diameter of the female screw in the attachment hole.

SUMMARY OF THE INVENTION

In the structure of chassis members for use in the laptop PC as described in Japanese Unexamined Patent Application Publication No. 2018-44590, a special screw that includes the right-handed screw portion and left-handed screw portion is used, and thus manufacturing and product costs are increased.

In addition, no washer is provided in the laptop PC as described in Japanese Unexamined Patent Application Publication No. 2018-44590. In order to provide a washer, for example, insertion of a plastic washer whose internal diameter is slightly smaller than an outer shape of the screw portion with a little strong force allows the plastic washer to be interposed between the screw portion and a head portion, however, it is poor in assembly workability.

Further, the main body chassis includes a noise generation source such as a CPU and it is preferable that the chassis member is electrically connected with a grand pattern when it functions as a shield for it. One way to achieve this can be to electrically connect a stud in contact with the grand pattern with the chassis member via the washer. However, the plastic washer is an insulator and thus has no conduction. Although a so-called C-ring or E-ring may be made of metal unlike a normal circular washer, there are concerns that it may fall off when applied to a small screw and furthermore it requires a certain degree of skill to attach it because a component is small.

One way to electrically connect the chassis member with the grand pattern without any washer can be, for example, to interpose a conductive sponge between a main board where a CPU is mounted and the chassis member. However, so many conductive sponges are provided in order to ensure sufficient conduction and thus an area for arranging conductive sponges on the main board must be ensured. In addition, the conductive sponge needs to be somewhat strongly compressed and is poor in assembly workability.

The present invention has been made in view of the above-described problem and has an object to provide an electronic apparatus and a structure though with a simple structure in which a screw and a washer for fixing a fixing member and a fixed member do not fall off. In addition, it is more preferable if conduction can be ensured between the fixing member and the fixed member via a washer.

In order to solve the above-mentioned problem and achieve the object, an electronic apparatus according to the first aspect of the present invention includes a fixed member in which an attachment hole is formed, a fixing member provided with a stud having a first female screw portion, a screw configured to fix the fixed member and the fixing member, and a washer to be attached to the screw, in which the screw has a head portion provided at a proximal end and having a diameter larger than that of the attachment hole, a male screw portion provided at a distal end and configured to be screwed into the first female screw portion, and a columnar portion provided between the head portion and the male screw portion, and having a diameter smaller than a root diameter of the male screw portion, the washer has a flange portion provided at a distal end and having a diameter larger than that of the attachment hole, a cylindrical portion provided at a proximal end and having a diameter smaller than that of the attachment hole, and a second female screw portion axially penetrating, which the male screw portion is screwable into and passable through, the head portion abuts on the fixed member to fix the fixed member by the male screw portion passing through the second female screw portion to be screwed into the first female screw portion, and the flange portion is disposed between the stud and the fixed member.

In addition, in order to solve the above-mentioned problem and achieve the object, a structure according to the second aspect of the present invention includes a fixed member in which an attachment hole is formed, a fixing member provided with a stud having a first female screw portion, a screw configured to fix the fixed member and the fixing member, and a washer to be attached to the screw, in which the screw has a head portion provided at a proximal end and having a diameter larger than that of the attachment hole, a male screw portion provided at a distal end and configured to be screwed into the first female screw portion, and a columnar portion provided between the head portion and the male screw portion, and having a diameter smaller than a root diameter of the male screw portion, the washer has a flange portion provided at a distal end and having a diameter larger than that of the attachment hole, a cylindrical portion provided at a proximal end and having a diameter smaller than that of the attachment hole, and a second female screw portion axially penetrating, which the male screw portion is screwable into and passable through, the head portion abuts on the fixed member to fix the fixed member by the male screw portion passing through the second female screw portion to be screwed into the first female screw portion, and the flange portion is disposed between the stud and the fixed member.

In these electronic apparatus and structure, since an outer diameter of the male screw portion is larger than an inner diameter of the second female screw portion, the screw does not slip out to the bottom and the washer does not slip out to the top. Therefore, neither the screw nor the washer falls off from the attachment hole. In addition, the screw and washer have simple structures with no reverse screw etc.

A sponge for filling a gap between the flange portion and the fixed member may be provided. With such a sponge, it is possible to moderately press the fixed member to allow for fixation without rattling.

An abutment surface with the sponge, of the fixed member, an abutment surface with the stud, of the fixing member, the stud, the washer, and the sponge each may have conductivity. Such a structure can ensure conduction between the fixing member and the fixed member via the washer.

The electronic apparatus includes a chassis configured to store electronic components, and when the fixed member is a cover constituting a part of the chassis, loss of screws and washers can be prevented in attaching or detaching the cover.

The electronic apparatus includes a chassis configured to store electronic components, and when the fixed member is a heat spreader provided in the chassis and configured to radiate heat of the electronic components, loss of screws and washers can be prevented in attaching or detaching the heat spreader.

When an outer shape of the flange portion is a non-circular shape, turning together does not occur when it is attached to a jig etc. and a screw is screwed.

According to one aspect of the present invention, since the outer diameter of the male screw portion is larger than the inner diameter of the second female screw portion, the screw does not slip out to the bottom and the washer does not slip out to the top. Therefore, neither the screw nor the washer falls off from the attachment hole. In addition, the screw and washer have simple structures with no reverse screw etc.

DETAILED DESCRIPTION OF THE INVENTION

Hereinafter, embodiments of an electronic apparatus and a structure according to the present invention are described in detail based on the drawings. It is to be noted that the present invention is not limited by the embodiments.

Figure 1:
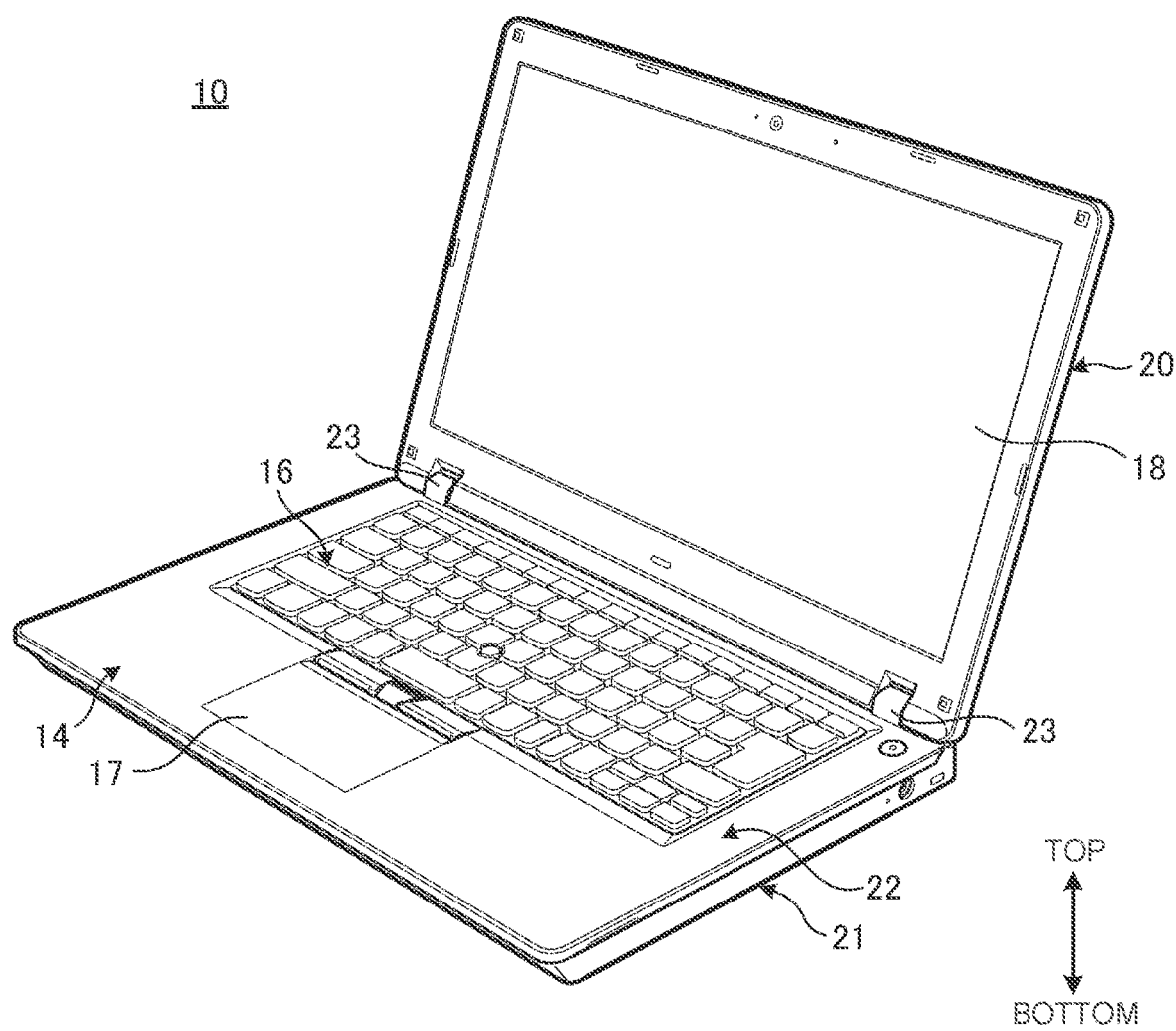
FIG. 1 is a perspective view of an electronic apparatus according to one embodiment of the present invention.

FIG. 1 is a perspective view illustrating an electronic apparatus 10 that is one embodiment of the present invention. The electronic apparatus 10 is a laptop PC. The present invention can be used for various electronic apparatuses such as a desktop PC, tablet PC, smartphone, and portable telephone. In addition, the present invention can also be applied to a so-called foldable PC including, for example, a foldable display (organic EL type etc.).

Figure 3:
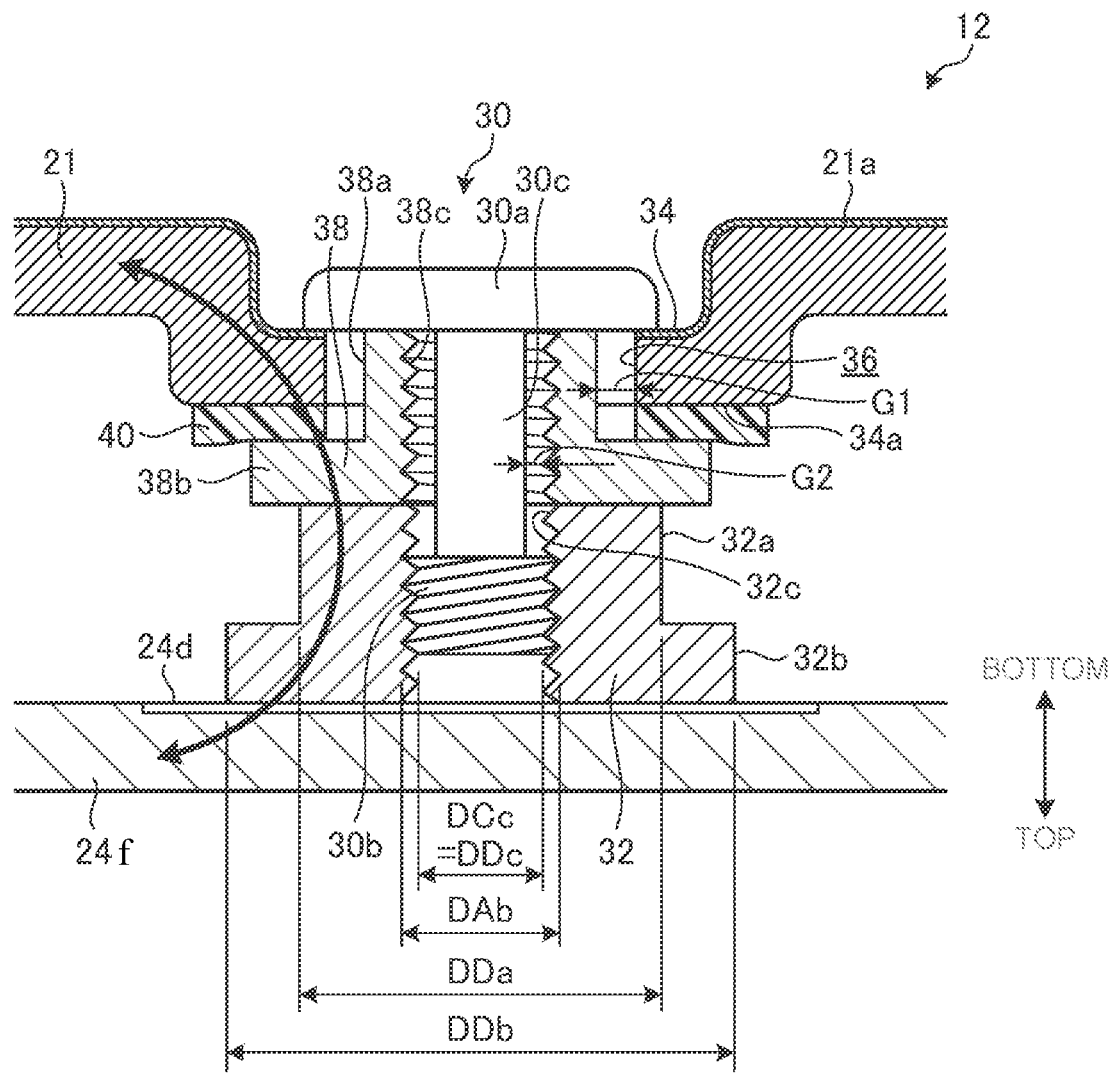
FIG. 3 is a cross-sectional side view of a structure according to one embodiment of the present invention.

The electronic apparatus 10 includes a structure 12 according to one embodiment of the present invention (refer to FIG. 3). The structure according to the present invention can be applied to other structures in which a fixing member and a fixed member are fixed with screws.

Hereinafter, based on the usage form of the electronic apparatus 10 and structure 12 illustrated in FIG. 1, a side of a main body chassis 14 constituting the electronic apparatus 10 where a keyboard device 16 is exposed is defined as "top," while its opposite side is defined as "bottom." The top-and-bottom direction is also referred to as an axial direction.

As illustrated in FIG. 1, the electronic apparatus 10 includes the main body chassis 14 that has input means such as the keyboard device 16 and a touch pad 17, and a rectangular flat plate-shaped display chassis 20 that has a display device 18 including a liquid crystal display etc.

The main body chassis (chassis) 14 is in a shape of a flat box made by connecting a bottom cover (cover) 21 and a top cover 22. The bottom cover 21 and the top cover 22 each constitute the main body chassis 14. The bottom cover 21 and the top cover 22 are made of electromagnetic noise shielding material that is conductive, for example, magnesium alloy, aluminum alloy or carbon material. Various electronic components such as a main board 24 and a battery 26 (refer to FIG. 2) are stored inside the main body chassis 14. The keyboard device 16 and touch pad 17 are disposed in the center of the top cover 22 that constitutes a top surface of the main body chassis 14.

The display chassis 20 is coupled to a rear edge part of the main body chassis 14 via hinges 23 so that it can be opened and closed, and is electrically connected to the main body chassis 14 by a cable (not shown) that passes through the hinge 23. The display device 18 is, for example, a liquid crystal display.

Figure 2:
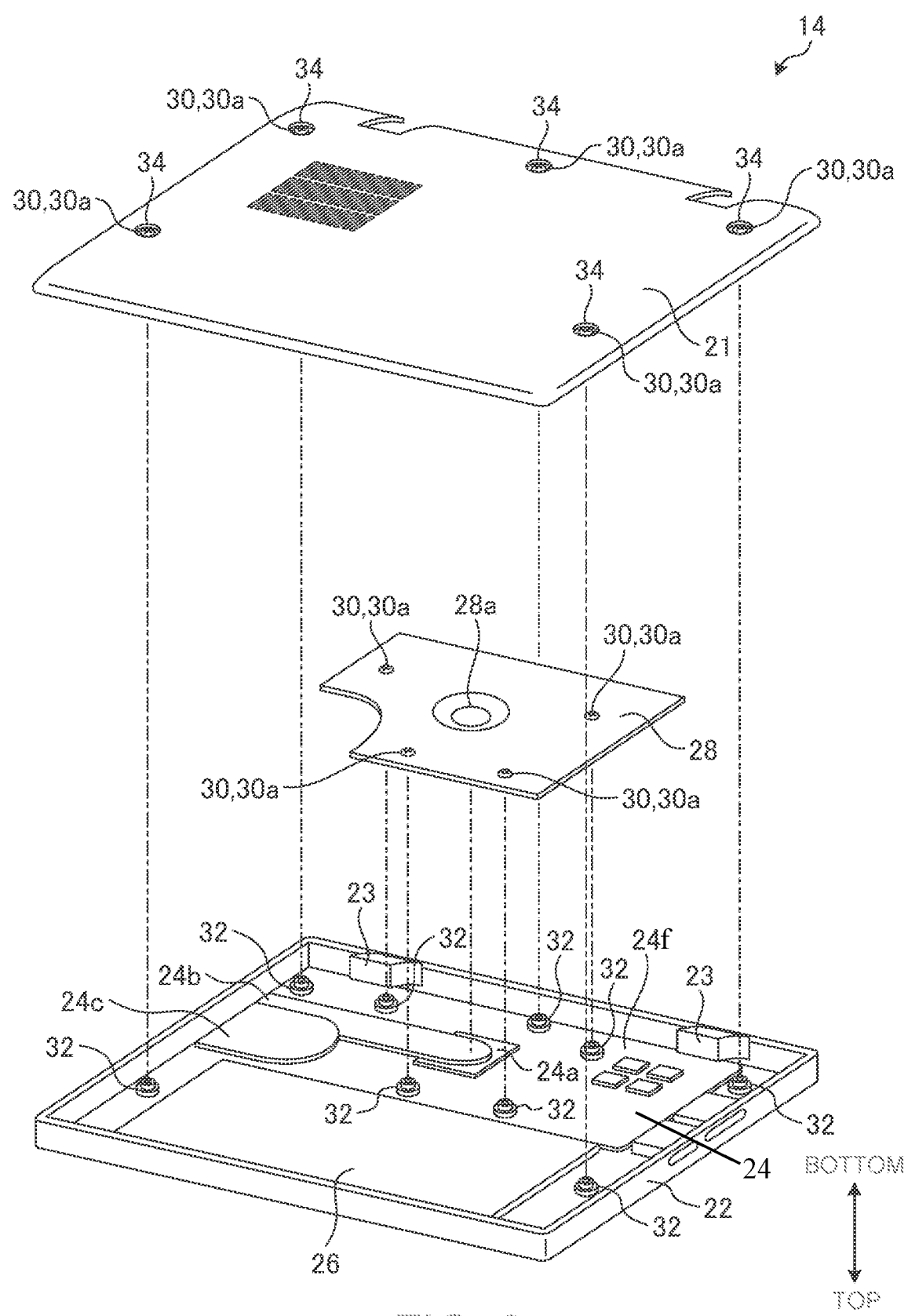
FIG. 2 is an exploded perspective view of a main body chassis as viewed from an obliquely downward direction.

FIG. 2 is an exploded perspective view of the main body chassis 14 as viewed from an obliquely downward direction. As illustrated in FIG. 2, the main board 24 and battery 26 etc. are stored in the top cover 22 of the main body chassis 14. A CPU (electronic component) 24a is mounted on a planar board portion 24f of the main board 24. The CPU 24a is a heating element, and a heat pipe 24b and a fan 24c radiate heat and cool. In addition, a heat spreader 28 also heatsinks and cools the CPU 24a. The heat spreader 28 is a metallic plate that has high heat transference and high conductivity, for example, a copper plate. The heat spreader 28 has a moderately large area, thermally contacts the CPU 24a at a convex 28a, and dissipates the heat of the CPU 24a. The heat spreader 28 covers the CPU 24a, and has a function of shielding electromagnetic noise of the CPU 24a.

The heat spreader 28 is provided with a plurality of screws 30 and fixed to the main board 24 with the screws 30. The main board 24 is provided with studs 32 into which the screws 30 are screwed. The studs 32 are also provided on the top cover 22. The screw 30 and stud 32 will be mentioned in detail.

A plurality of concaves 34 is formed in the bottom cover 21 along its edge. The concave 34 is provided with an attachment hole 36 (refer to FIG. 3). The screw 30 is provided in each attachment hole 36. This screw 30 is the same as that provided in the heat spreader 28. Since a head portion 30a of the screw 30 is within the concave 34, it has no interference with a placement surface on which the electronic apparatus 10 is placed, is inconspicuous, and it is also appropriate in design. A coated film 21a (refer to FIG. 3) is formed on a surface of the bottom cover 21.

Figure 4:
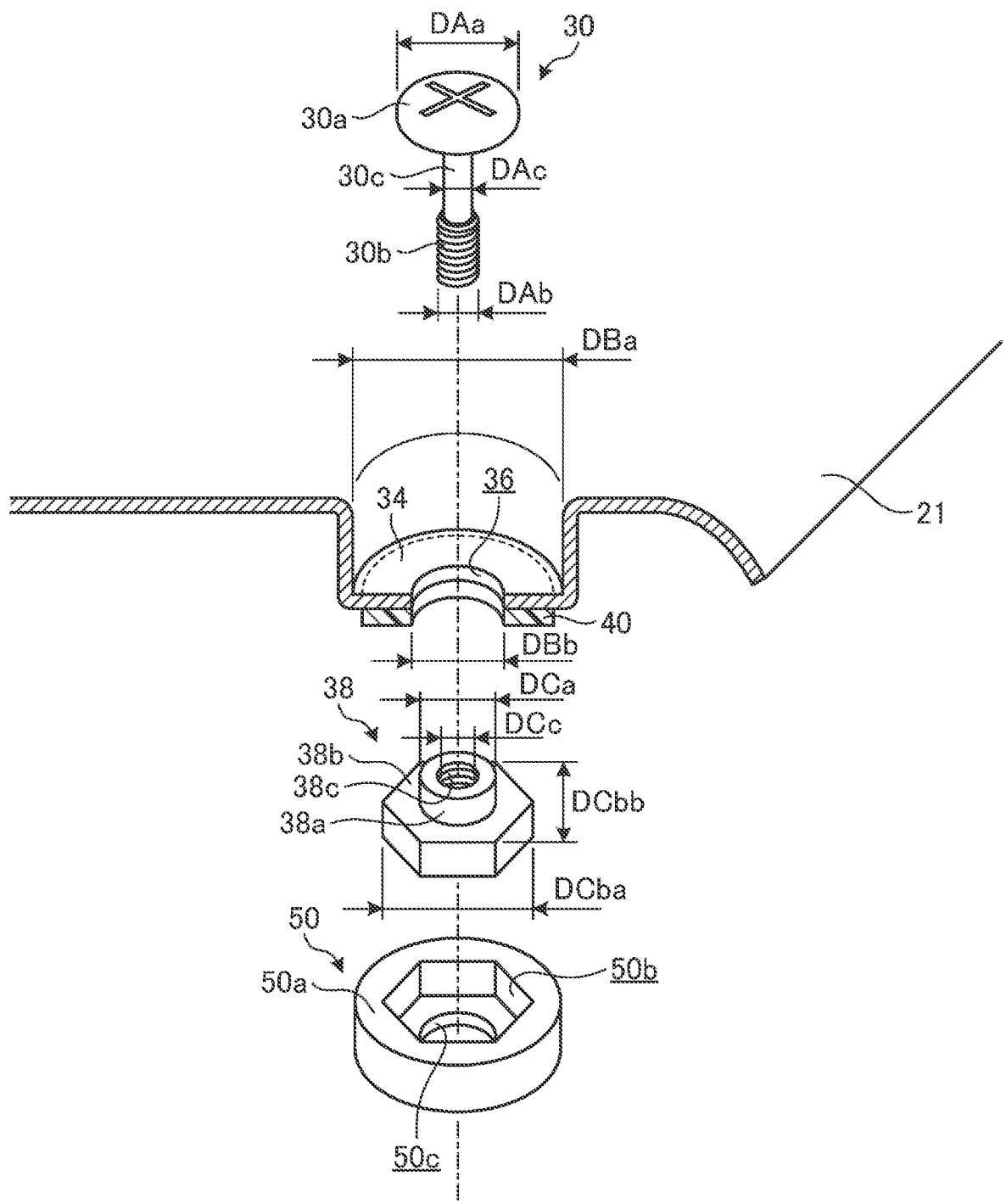
FIG. 4 is an exploded perspective view of a screw, bottom cover, washer, and assembly jig.

FIG. 3 is a cross-sectional side view of the structure 12 according to one embodiment of the present invention. The structure 12 fixes the bottom cover 21 as a fixed member in which the attachment hole 36 is formed and the main board 24 as a fixing member on which the stud 32 is provided. The fixing member and fixed member in the context of the present application are terms for distinction, which are interchangeable. The structure 12 has the screw 30, stud 32, a washer 38, and a sponge 40, in addition to the bottom cover 21 and the planar board portion 24f of the main board 24. It is to be noted that some of diameters of respective parts of the components of the structure 12 are illustrated in FIG. 4, in order to prevent FIG. 3 from becoming confusing. The bottom end part of the structure 12 is also referred to as a "proximal end" and the top end part of the structure 12 is also referred to as a "distal end."

The structure 12 is also applied to fixation of the heat spreader 28 and the main board 24 and fixation of the bottom cover 21 and the top cover 22, in addition to the fixation of the bottom cover 21 and the main board 24 as described above (refer to FIG. 2). Although these will not be illustrated, the bottom cover 21 in FIG. 3 only needs to be replaced with the heat spreader 28 at a fixing point of the heat spreader 28 and the main board 24, and the main board 24 in FIG. 3 only needs to be replaced with the top cover 22 in a fixing point of the bottom cover 21 and the top cover 22. In addition, the structure 12 can also be used to fix, for example, the keyboard device 16 to the top cover 22.

The screw 30 has the head portion 30a provided at a proximal end, a male screw portion 30b provided at a distal end, and a columnar portion 30c provided between the head portion 30a and the male screw portion 30b. The screw 30 is made of metal but may be made of resin. Since a relatively small fastening force suffices in order to fix the bottom cover 21, a small one, such as M2 or M3, can be used for the male screw portion 30b and female screw portions 32c and 38c as mentioned below.

The stud 32 is a stepped cylindrical part made of metal and has a small diameter portion 32a at the bottom and a large diameter portion 32b at the top. The female screw portion (first female screw portion) 32c is formed in an axial through-hole in the center of the stud 32. The male screw portion 30b of the screw 30 is screwed into the female screw portion 32c. The large diameter portion 32b is fixed to the main board 24, and contacts and is electrically connected to a grand pattern 24d.

The washer 38 is a stepped shape part made of metal and has a cylindrical portion 38a provided at a proximal end (i.e., bottom) and a flange portion 38b provided at a distal end (i.e., top). The female screw portion (second female screw portion) 38c is formed in an axial through-hole of the washer 38. The female screw portion 38c has a shape such that the male screw portion 30b of the screw 30 can be screwed into. That is, the female screw portion 32c of the stud 32 and the female screw portion 38c of the washer 38 are of the same specification. In a state in which the bottom cover 21 and main board 24 are fixed by the structure 12, the male screw portion 30b has passed through the female screw portion 38c and the columnar portion 30c of the screw 30 is disposed in a hollow portion that is surrounded by the female screw portion 38c. The washer 38 is clamped between the head portion 30a and the stud 32. In a state before the structure 12 fastens the bottom cover 21 and the main board 24 (refer to FIG. 6), the washer 38 is rotatable with respect to the screw 30.

The sponge 40 has an annular shape and has a moderate thickness so that it is elastically clamped between a seating surface 34a corresponding to a top surface of the concave 34 and the flange portion 38b. The sponge 40 has conductivity. The sponge 40 is fixed to the seating surface 34a by a conductive adhesive or an adhesive tape etc. and is electrically connected with the bottom cover 21. The sponge 40 fills a gap between the flange portion 38b and the seating surface 34a and moderately presses the bottom cover 21 to allow for fixation without rattling. In addition, the interposition of the sponge 40 allows some axial dimension error of the attachment hole 36, washer 38, and stud 32.

An outer diameter DAa of the head portion 30a is smaller than an inner diameter DBa of the concave 34 and larger than an inner diameter DBb of the attachment hole 36. Thus, the head portion 30a can be stored in the concave 34 and its seating surface can abut on the bottom surface of the concave 34 to fix the bottom cover 21.

An outer diameter DAb of the male screw portion 30b is a so-called nominal diameter and is substantially equal to a root diameter of the female screw portion 32c and female screw portion 38c. In addition, a root diameter of the male screw portion 30b is substantially equal to an inner diameter DCc of the female screw portion 32c and an inner diameter DDc of the female screw portion 38c. An outer diameter DAc of the columnar portion 30c is a little smaller than the root diameter of the male screw portion 30b and the inner diameter DDc of the female screw portion 38c, and a gap G2 is formed between the columnar portion 30c and the female screw portion 38c. An axial length of the columnar portion 30c is longer than that of the washer 38. In addition, a total axial length of the columnar portion 30c and male screw portion 30b is shorter than a total length of the washer 38 and stud 32.

An axial length of the cylindrical portion 38a is a little smaller than a total of a thickness of the attachment hole 36 and a thickness of the sponge 40 in a non-compressed state. An outer diameter DCa of the cylindrical portion 38a of the washer 38 is smaller than the inner diameter DBb of the attachment hole 36, and a gap G1 is formed between the cylindrical portion 38a and the attachment hole 36. That is, the gap G1 and gap G2 are formed between the attachment hole 36 and the columnar portion 30c across the cylindrical portion 38a of the washer 38, and the bottom cover 21 and main board 24 can be laterally moved relative to each other by a total width of these. Thus, even when a plurality of structures 12 is provided, misregistration between them can be absorbed and thus no strain is generated in the bottom cover 21. Because of this, rocking does not occur when the apparatus is placed on a placement surface such as a desk and it does not become unstable, and thus reduction in product quality can be suppressed.

An outer shape of the flange portion 38b is a hexagonal shape (refer to FIG. 4) so that it serves an anti-rotation function on an assembly jig 50 as mentioned below. Although the outer shape of the flange portion 38b may be a non-circular shape other than a hexagonal shape, the hexagonal shape is a simple shape, easy to manufacture, and also well-balanced. In addition, if it is a hexagonal shape, a general-purpose tool such as a hexagon socket can be used, other than the assembly jig 50. The outer shape of the flange portion 38b is represented by a maximum diameter DCba corresponding to a circumscribed circle diameter of the hexagon and a minimum diameter DCbb corresponding to an inscribed circle diameter. The flange portion 38b is moderately thin.

In the flange portion 38b, at least the maximum diameter DCba is set to be larger than the inner diameter DBb of the attachment hole 36, and more preferably, the minimum diameter DCbb is set to be larger than the inner diameter DBb of the attachment hole 36. With this, since the flange portion 38b abuts on the seating surface 34a via the sponge 40, it functions as a washer. A function of the washer is, for example, to prevent looseness of the screw 30 and to improve compatibility between the stud 32 and the head portion 30a. In addition, since the minimum diameter DCbb is set to be larger than the inner diameter DBb of the attachment hole, the washer 38 does not slip out to the bottom.

An outer diameter DDa of the small diameter portion 32a of the stud 32 is an appropriate dimension for abutment on the flange portion 38b. The outer diameter DDb of the large diameter portion 32b of the stud 32 is an appropriate dimension for fixation to the main board 24. The shape of the stud 32 is not limited to this, and for example, the outer diameter DDa may be equal to the outer diameter DDb. An inner diameter of the sponge 40 is nearly equal to the inner diameter DBb of the attachment hole 36.

Next, an assembling method of the structure 12 is described.

Figure 5:
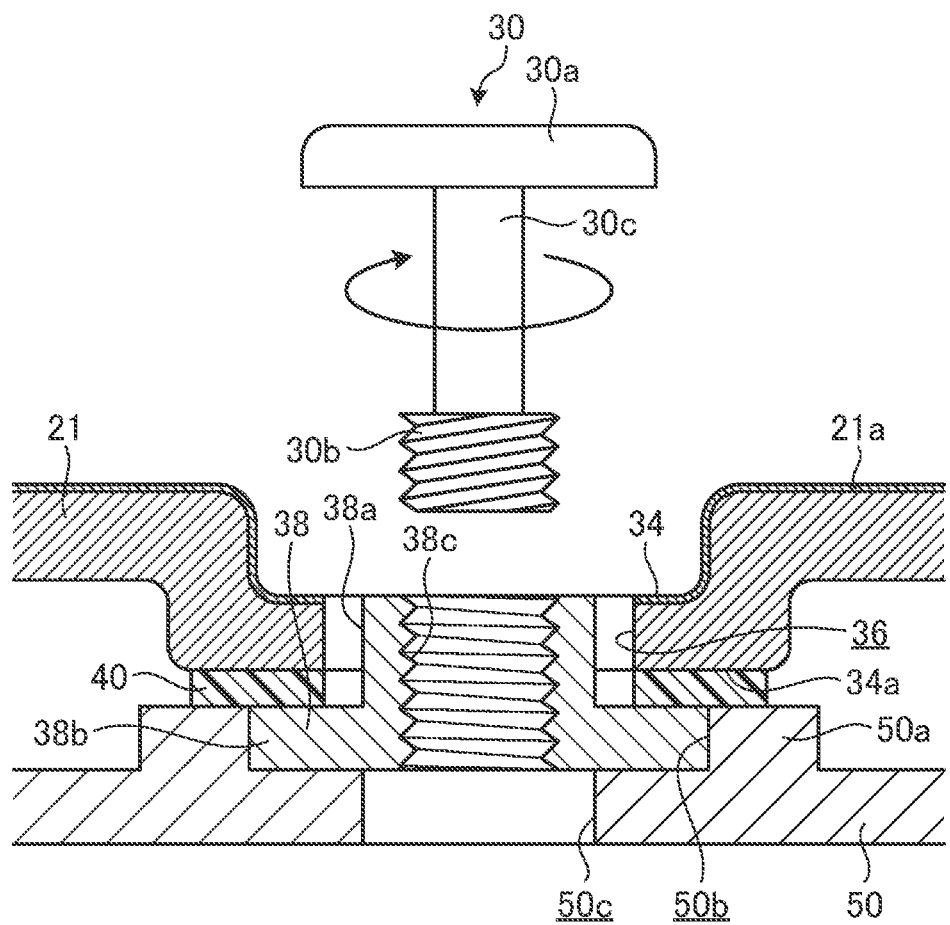
FIG. 5 is a cross-sectional side view of the screw, bottom cover, washer, and assembly jig.
Figure 6:
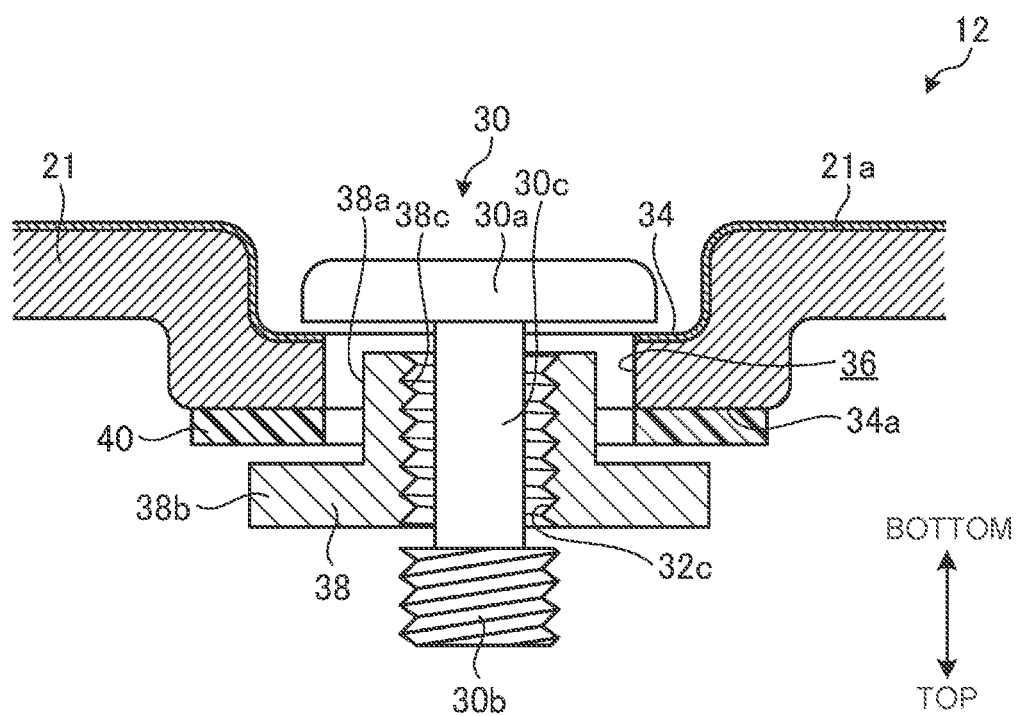
FIG. 6 is a cross-sectional side view of the screw in a state in which the bottom cover and washer are attached.

FIG. 4 is an exploded perspective view of the screw 30, bottom cover 21, washer 38, and assembly jig 50. FIG. 5 is a cross-sectional side view of the screw 30, bottom cover 21, washer 38, and assembly jig 50. FIG. 6 is a cross-sectional side view of the screw 30 in a state in which the bottom cover 21 and washer 38 are attached.

As illustrated in FIG. 4 and FIG. 5, the bottom cover 21, screw 30, and washer 38 are assembled using the assembly jig 50. The assembly jig 50 is composed of a column-shaped portion 50a. A positioning recessed portion 50b opened to one side is formed in the center of the column-shaped portion 50a. The positioning recessed portion 50b is a hexagonal recessed portion into which the flange portion 38b of the washer 38 fits. A through-hole 50c is formed in the bottom surface of the positioning recessed portion 50b. An inner diameter of the through-hole 50c is larger than the male screw portion 30b.

As illustrated in FIG. 5, in order to assemble the bottom cover 21, screw 30, and washer 38, the flange portion 38b is fitted into the positioning recessed portion 50b, and the bottom cover 21 is set so that the cylindrical portion 38a of the washer 38 and the attachment hole 36 become concentric. A predetermined positioning jig may be used to set the bottom cover 21. The sponge 40 is preliminarily attached to the seating surface 34a.

Then, the head portion 30a of the screw 30 is turned by a turning means such as a driver to screw the male screw portion 30b into the female screw portion 38c of the washer 38. At this time, the washer 38 does not turn along with the screw 30 since the flange portion 38b whose outer shape is a non-circular shape fits into the positioning recessed portion 50b of the same shape.

Further, the screw 30 is fully turned until the male screw portion 30b passes through the female screw portion 38c. The male screw portion 30b that has passed through the female screw portion 38c, has also passed through the through-hole 50c to project from the assembly jig 50. After this, the assembly jig 50 is removed from the washer 38. Then, the assembled bottom cover 21, screw 30, and washer 38 become a state as illustrated in FIG. 6.

As illustrated in FIG. 6, since the head portion 30a is larger than the attachment hole 36, the screw 30 does not slip out to the top. Since the flange portion 38b has a diameter larger than that of the attachment hole 36, the washer 38 does not slip out to the bottom. Since the outer diameter of the male screw portion 30b is larger than the inner diameter of the female screw portion 38c, the screw 30 does not slip out to the bottom and the washer 38 does not slip out to the top. This is because respective screw threads of the male screw portion 30b of the screw 30 and female screw portion 38c of the washer 38 axially interfere with each other. Thus, neither the screw 30 nor the washer 38 falls off from the attachment hole 36. Therefore, when a user detaches the bottom cover 21 from the main body chassis 14 or in the manufacturing and assembling process of the electronic apparatus 10, losing the screws 30 or washers 38 or forgetting to attach the washers 38 can be prevented.

When the bottom cover 21 is assembled into the main body chassis 14, the head portion 30a of the screw 30 is turned by a turning means such as a driver to screw the male screw portion 30b into the female screw portion 32c of the stud 32. This forms the structure 12 as illustrated in FIG. 3.

In the thus configured electronic apparatus 10 and structure 12, the screw 30 and washer 38, which are fixing means for fixing the bottom cover 21 and the main board 24, do not fall off. In addition, the screw 30 and washer 38 have simple structures with no reverse screw and manufacturing cost and product cost can be lowered.

In order to attach the washer 38 to the screw 30, after fixing the washer 38 by the assembly jig 50, the screw 30 only needs to be turned to screw the male screw portion 30b into the female screw portion 38c. Therefore, no particular skill is needed even though the screw 30 and washer 38 are small parts and workability is excellent. Since the washer 38 is annular and does not have any opening unlike a C-ring, it does not radially disengage from the screw 30.

Since the sponge 40 is disposed concentrically with the attachment hole 36, it is compressed directly by the seating surface 34a and flange portion 38b and moderately strongly clamped therebetween to have good conductivity and dust resistance.

As illustrated in FIG. 3, the seating surface 34a, which is at least an abutment surface with the sponge 40, of the bottom cover 21 that is the fixed member, has conductivity, and the grand pattern 24d, which is at least an abutment surface with the stud 32, of the main board 24 that is the fixing member, has conductivity. In addition, since the stud 32, washer 38, and sponge 40 also have conductivity, the bottom cover 21 and main board 24 are electrically connected as indicated by a thick arrow. Therefore, the bottom cover 21 serves a shielding function against a noise generation source such as the CPU 24a. It is to be noted that, when the bottom cover 21 is replaced with the heat spreader 28, it is a matter of course that the heat spreader 28 serves the shielding function.

In the structure 12, conduction between the seating surface 34a and the grand pattern 24d is ensured via the washer 38 and sponge 40, and thus, an insulator may be used for the screw 30. In addition, the coated film 21a may also be an insulating film.

A plurality of screws is generally used to fix a cover to a main body chassis of a laptop PC. Also, in the electronic apparatus 10 according to the present embodiment, a plurality of structures 12 is provided to fix the bottom cover 21 to the main body chassis 14. Therefore, conduction paths between the bottom cover 21 and the main board 24 via the sponge 40 are formed at a plurality of positions and moderate conductivity is ensured. This can eliminate the need for other conducting means between the main board 24 and the bottom cover 21 or reduce the number thereof, and an area margin is generated in the main board 24 to improve a degree of freedom of component layout.

Figure 7:
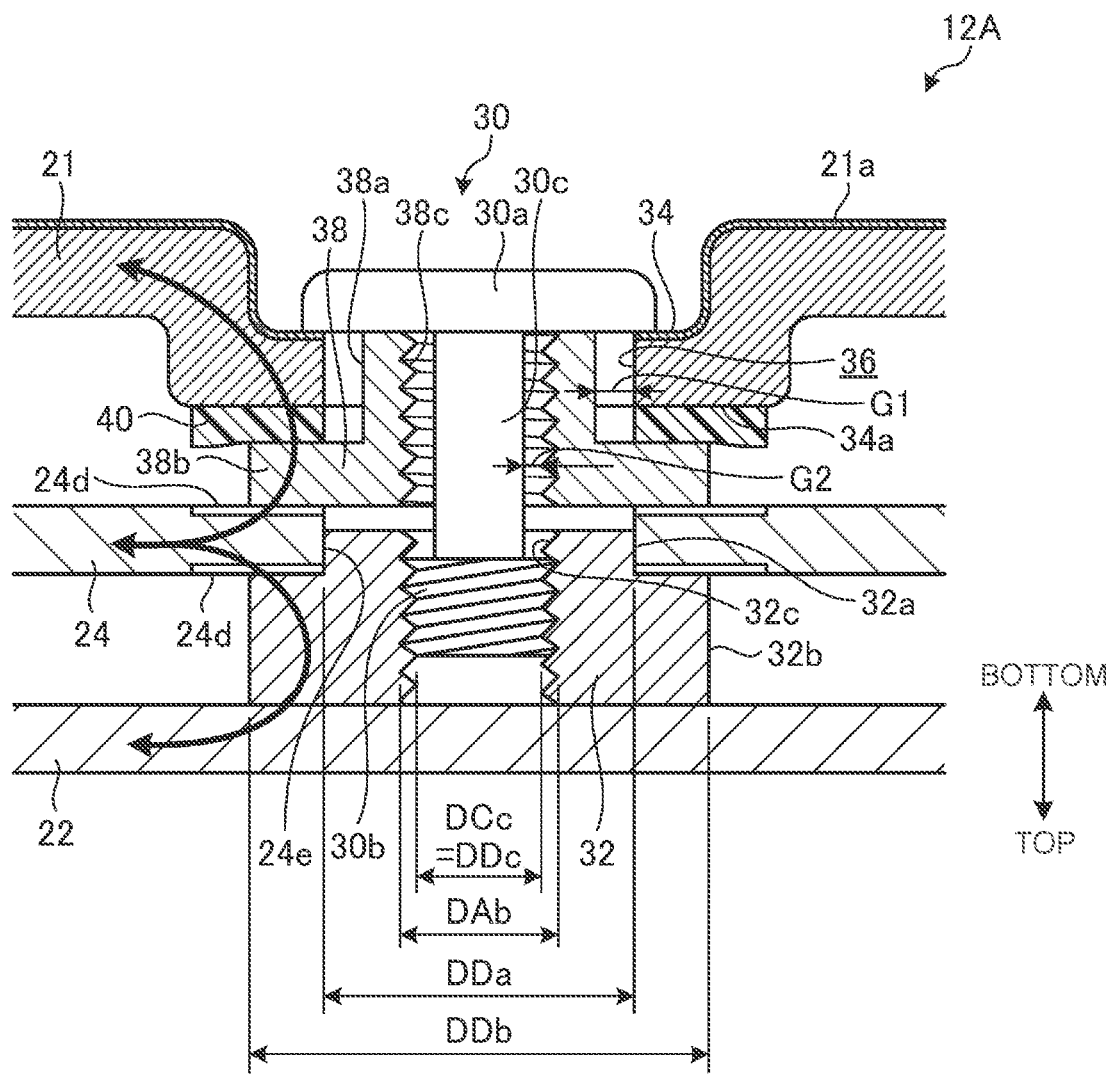
FIG. 7 is a cross-sectional side view of a structure according to a first modification.
Figure 8:
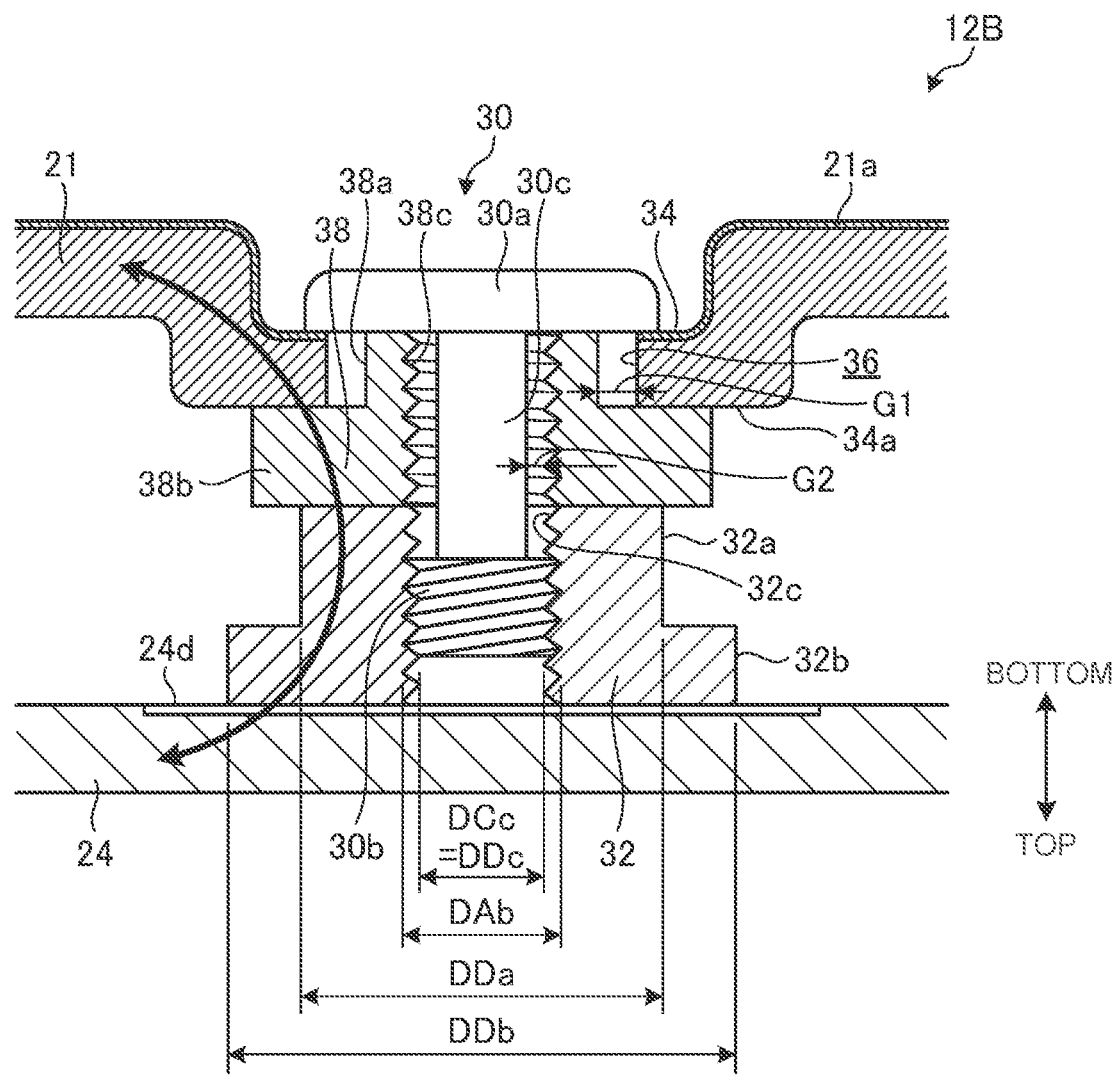
FIG. 8 is a cross-sectional side view of a structure according to a second modification.

FIG. 7 is a cross-sectional side view of a structure 12A according to a first modification. FIG. 8 is a cross-sectional side view of a structure 12B according to a second modification. In the structures 12A and 12B, the same components as those of the above-described structure 12 are assigned by the same symbols and the detailed description thereof will be omitted.

As illustrated in FIG. 7, in the structure 12A according to the first modification, the stud 32 is provided on an inner surface of the top cover 22, and the main board 24 is clamped between the large diameter portion 32b of the stud 32 and the flange portion 38b. The small diameter portion 32a of the stud 32 penetrates into a through-hole 24e of the main board 24 and does not project from the through-hole 24e to the bottom. When the grand pattern 24d is provided on both surfaces of the main board 24 and contacts the flange portion 38b and the large diameter portion 32b, respectively, the main board 24 can ensure conduction with the bottom cover 21 and top cover 22 as indicated by two thick arrows.

This structure 12A can fix the bottom cover 21 as the fixed member and the top cover 22 as the fixing member, and further fix the main board 24. In the structure 12A, the main board 24 can be conceptually regarded as a part of the stud 32.

As illustrated in FIG. 8, the flange portion 38b of the washer 38 in the structure 12B according to the second modification is a little thick, and accordingly, the above-described sponge 40 is omitted. That is, when an axial thickness of the attachment hole 36 and an axial length of the cylindrical portion 38a of the washer 38 match with good accuracy, a configuration can be further simplified by omitting the sponge 40. Also, in this structure 12B, the conduction between the main board 24 and the bottom cover 21 is ensured as indicated by a thick arrow.

It is a matter of course that the present invention is not limited to the embodiments described above and can be freely altered without deviating from the spirit of the present invention.

The invention claimed is:

1. An electronic apparatus comprising:
a fixed member having an attachment hole;
a fixing member having a planar board portion, a stud and a first female screw portion;
a screw that fixes the fixed member to the fixing member; and
a washer that is attached to the screw,
wherein the stud and the first female screw portion of the fixing member are both disposed entirely between the planar board portion of the fixing member and the washer,
wherein the screw has:
a head portion at a head portion proximal end thereof and has a head portion diameter larger than that of the attachment hole;
a male screw portion at a male screw portion distal end thereof that screws into the first female screw portion; and
a columnar portion between the head portion and the male screw portion, and having a columnar portion diameter smaller than a root diameter of the male screw portion,
wherein the washer has:
a flange portion at a flange portion distal end thereof and has a flange portion diameter larger than that of the attachment hole;
a cylindrical portion at a cylindrical portion proximal end thereof and has a cylindrical portion diameter smaller than that of the attachment hole; and
a second female screw portion axially disposed, and into which the male screw portion is screwable and passable through,
the head portion abuts on the fixed member to fix the fixed member by the male screw portion passing through the second female screw portion and screwing into the first female screw portion, and
the flange portion is between the stud and the fixed member.

2. The electronic apparatus according to claim 1, wherein a sponge is in between the flange portion and the fixed member.

3. The electronic apparatus according to claim 2, wherein an abutment surface of the fixed member, an abutment surface of the fixing member, the stud, the washer, and the sponge each have conductivity.

4. The electronic apparatus according to claim 1, further comprising a chassis that stores electronic components, wherein the fixed member is a cover constituting a part of the chassis.

5. The electronic apparatus according to claim 1, further comprising a chassis that stores electronic components, wherein the fixed member is a heat spreader in the chassis that radiates heat of the electronic components.

6. The electronic apparatus according to claim 1, wherein an outer shape of the flange portion is a non-circular shape.

7. A structure comprising:
a fixed member having an attachment hole;
a fixing member having a planar board portion, a stud and a first female screw portion;
a screw that fixes the fixed member to the fixing member; and
a washer that is attached to the screw,
wherein the stud and the first female screw portion of the fixing member are both disposed entirely between the planar board portion of the fixing member and the washer,
wherein the screw has:
a head portion at a head portion proximal end thereof and has a head portion diameter larger than that of the attachment hole;
a male screw portion at a male screw portion distal end thereof that screws into the first female screw portion; and
a columnar portion between the head portion and the male screw portion, and having a columnar portion diameter smaller than a root diameter of the male screw portion,
wherein the washer has:
a flange portion at a flange portion distal end thereof and has a flange portion diameter larger than that of the attachment hole;
a cylindrical portion provided at a cylindrical portion proximal end thereof and has a cylindrical portion diameter smaller than that of the attachment hole; and a second female screw portion axially disposed, and into which the male screw portion is screwable and passable through, the head portion abuts on the fixed member to fix the fixed member by the male screw portion passing through the second female screw portion and screwing into the first female screw portion, and the flange portion is between the stud and the fixed member.

\* \* \* \* \*